United States Patent [19]

Interrante et al.

[11] Patent Number: 5,425,493
[45] Date of Patent: Jun. 20, 1995

[54] SELECTIVE ADDITION OF A SOLDER BALL TO AN ARRAY OF SOLDER BALLS

[75] Inventors: Mario J. Interrante, New Paltz; Laertis Economikos, Wappingers Falls, both of N.Y.

[73] Assignee: International Business Machines Corporation, Armonk, N.Y.

[21] Appl. No.: 288,520

[22] Filed: Aug. 10, 1994

[51] Int. Cl.⁶ .......................................... H01L 21/607
[52] U.S. Cl. ................................. 228/110.1; 228/254; 228/1.1; 228/41
[58] Field of Search ............... 228/110.1, 111, 111.5, 228/180.22, 254, 1.1, 41

[56] References Cited

U.S. PATENT DOCUMENTS

| | | | |
|---|---|---|---|
| 4,139,140 | 2/1979 | Stöckel | 228/110.1 |
| 5,058,798 | 10/1991 | Yamazaki et al. | 228/110.1 |
| 5,118,370 | 6/1992 | Ozawa | 228/1.1 |

*Primary Examiner*—Samuel M. Heinrich
*Attorney, Agent, or Firm*—Whitham, Curtis, Whitham & McGinn; Harold Huberfeld

[57] ABSTRACT

A specially designed tip containing an electron discharge milled cone of specific dimensions is used to transfer a critical solder volume from a solder ball carrier to a specific solder ball site on the base line metal on a high density chip, substrate terminal connection, solder ball connection, or any solder ball array. The critical tip/cone dimensions have a height of the cone and a circumference at the base which generate a specific volume of solder to be transferred.

8 Claims, 5 Drawing Sheets

SELECTIVE ADDITION OF A SOLDER BALL TO AN ARRAY OF SOLDER BALLS

BACKGROUND OF THE INVENTION

1. Field of the Invention

The present invention generally relates to the repair of electronic circuit modules and, more particularly, to the repair and recovery of circuit modules with defective solder ball connectors. The invention has particular application in the repair of integrated circuit (IC) chips requiring repair of solder ball connectors in an array of solder ball connectors on high density chips. IC chips are but one example of electronic circuit module, and other electronic circuit modules or interconnection devices employing arrays of solder balls may be repaired using the invention.

2. Description of the Prior Art

Chips can have many defects relating to solder balls. Chips with plated or evaporated solder balls may have solder ball mechanical damage, solder pads covered with foreign material, or random low volume pads. High density complimentary metal oxide semiconductor (CMOS) chips may contain as many as 4000 solder ball pads and are very expensive to replace if rejected because of solder ball defects.

It becomes necessary to modify or customize the electrical net list to fit a particular performance criteria. These modifications are called Engineering Changes (ECs). The Engineering Change process is complex, involving laser deletes and wire adds, and results in a considerable backlog of modules in the build, assembly and test (BAT) process during high volume production. Most of the congestion is caused by the need for wiring changes in configuring the electrical functionality of a large system. Temporary wiring changes need to be removed and restored to original circuitry causing even further congestion or delays in productivity in a high volume line.

A solder paste system may be used to repair chips with damaged solder balls. This system is limited to large pitch solder balls and cannot be used effectively on high density CMOS chips. The solder paste system has problems dispensing consistent solder volumes, as well as introducing contamination from paste materials.

SUMMARY OF THE INVENTION

It is therefore an object of the present invention to provide a tool which can be used to transfer a specific solder volume from a solder ball carrier to a specific solder ball site on a high density chip, substrate terminal connection, solder ball connection, or any solder ball array.

According to the invention, there is provided a process which involves lowering of a conical tip over a dummy solder ball, applying ultrasonic energy to ensure complete filling of the tip, and thus the appropriate solder volume, and then transferring that volume of solder to the specific active device, substrate or board solder ball site and securing it by use of ultrasonic energy. A wet set back reflow process, typically used in wafer fabrication, is then used to reconfigure the placed volume of solder into a spherical configuration.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
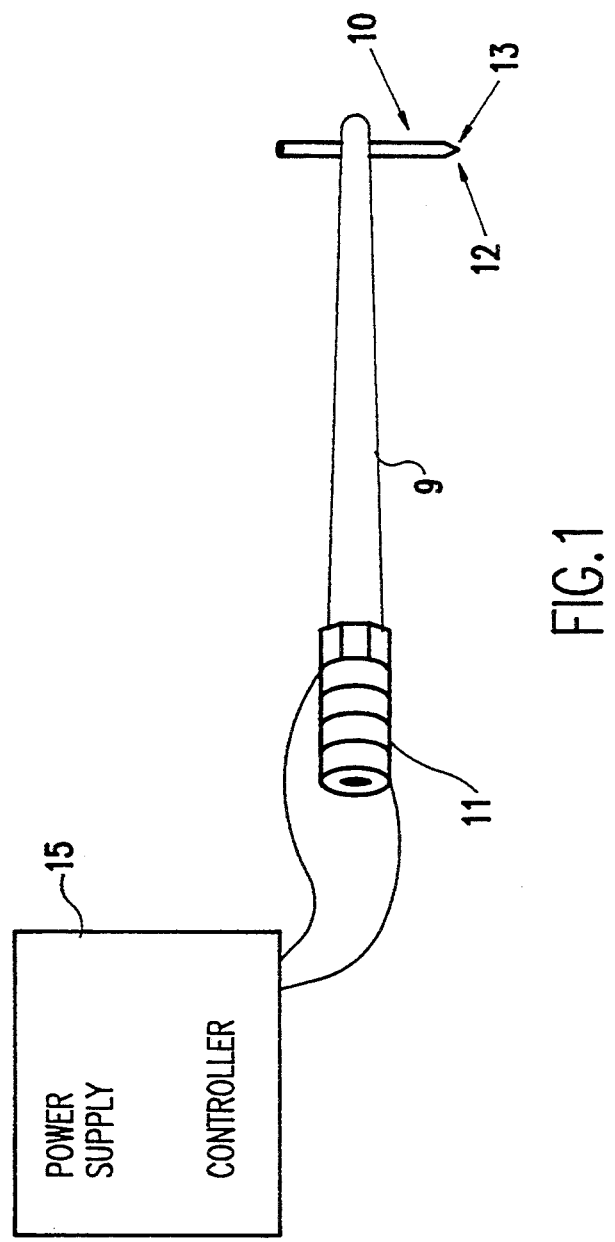
FIG. 1 is a side view of the tool according to the invention.

Referring now to the drawings, and more particularly to FIG. 1, there is shown the major components of the tool according to a preferred embodiment of the invention. The tool comprises a cylindrical body 10 having attached ultrasonic horn 9 and an ultrasonic transducer 11. The cylindrical body 10 has at one end a conical portion 12 terminating in a tip 13. The ultrasonic transducer 11 is connected to a controller 15 which applies energizing current to the transducer 11, setting up vibrations in the tool that propagate to the tip 13.

Figure 2A:
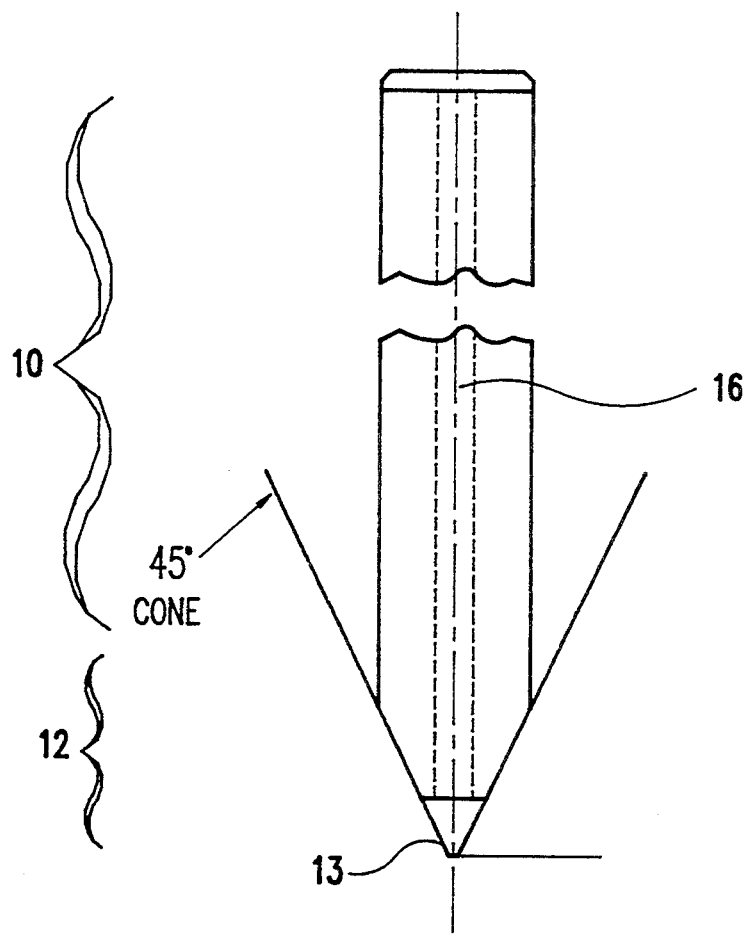
FIG. 2A is cross sectional view of the solder ball add tool.
Figure 2B:
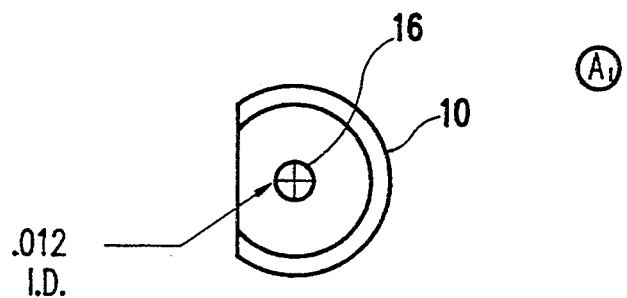
FIG. 2B is a horizontal section of the solder ball add tool.

In FIGS. 2A and 2B, there are shown detailed measurements of the cylindrical body 10 of the solder ball add tool. As can be seen in FIG. 2A, the conical portion 12 and the tip 13 form a 45° angle to the cylindrical body 10. FIG. 2B shows the horizontal cross section of the cylindrical body 10 which has an optional capillary 16 leading to the tip 13 of the solder ball add tool. The capillary 16 may be used to insert a laser or an optical fiber. Such a laser or optical fiber may be used to heat the tip 13, but it is not necessary to heat the tip 13 to operate the tool.

Figure 3:
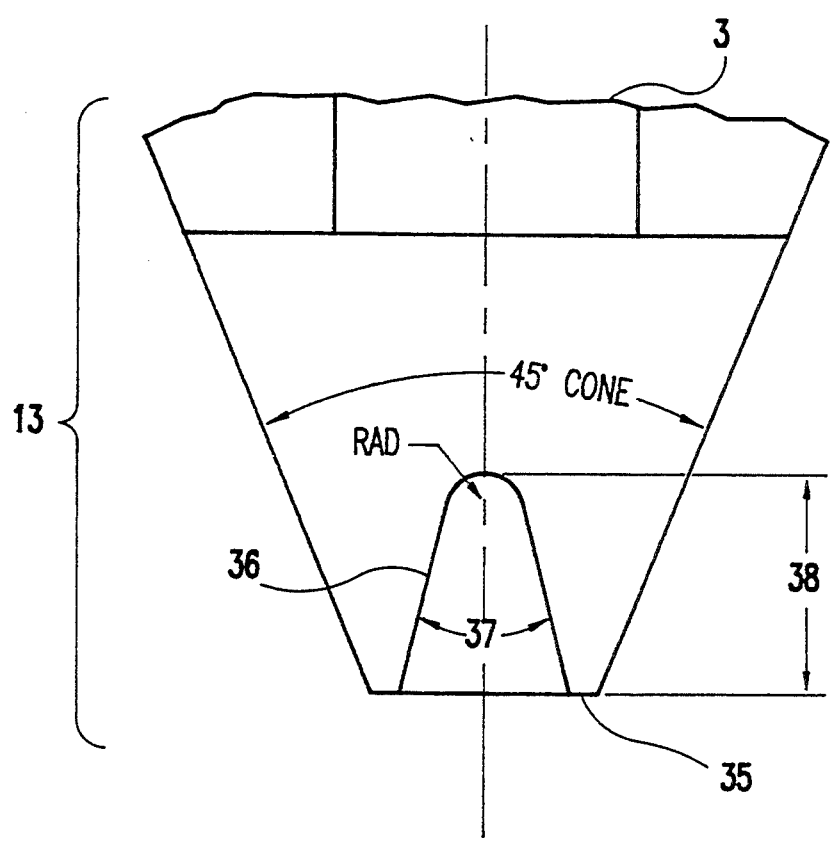
FIG. 3 is an expanded cross sectional view of the tip if the solder ball add tool.

FIG. 3 shows the tip 13 in more detail. At the head 35 of the tip 13 is shown an inverted cone 36, having an angle 37. The inverted cone has a volume slightly larger than the required solder ball volume. The cone angle 37 and cone height 38 are designed based on the required solder ball volume. If necessary, the volume of the inverted cone 36 may be adjusted to more precisely match the desired solder ball volume. When repairing one wafer, all replaced solder balls are likely to be of the same volume, and so the same tool may be used to make all repairs for the wafer. The tip 13 is preferably constructed from wear resistant materials such as tungsten, titanium, tungsten carbide, titanium carbide, or alumina, and is most preferably constructed from tungsten carbide.

Figure 4:
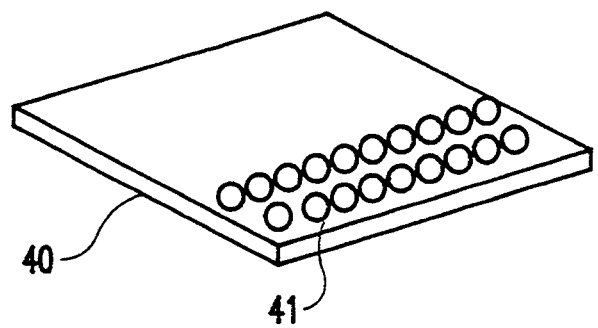
FIG. 4 is a pictorial representation of a high density chip to which a solder ball may be added.
Figure 5:
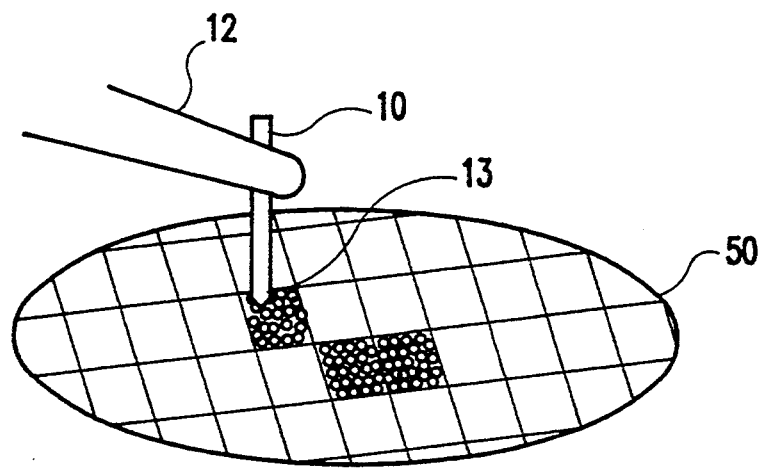
FIG. 5 is a pictorial representation depicting the tool and a wafer from which a solder ball may be removed.
Figure 6:
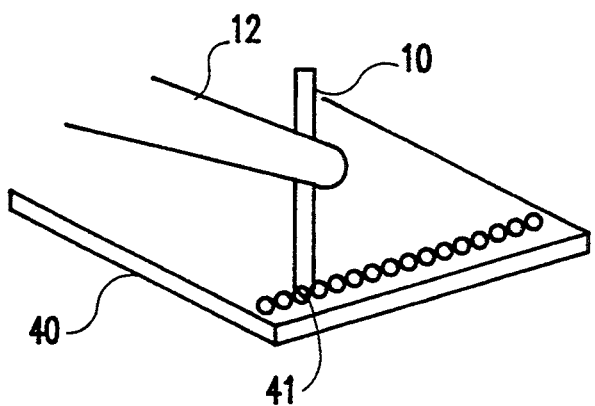
FIG. 6 is a pictorial representation depicting a high density chip to which a solder ball may be added.

FIGS. 4 through 6 illustrate the steps of adding a solder ball using the tool. In FIG. 4 a high circuit density chip 40 is shown with a space 41 where a solder ball has been removed. The solder ball may have been removed for engineering changes or because the ball had a defect, such as insufficient volume.

A silicon wafer 50 containing solder balls but no circuitry is shown in FIG. 5. This wafer comprises sacrificial chips 51 on which solder balls are formed, but not adhered to the chip as they would be if they were part of actual circuitry. One method of preparing the sacrificial chips is to use the same mask used in creating the chip on which repairs are being made. This would form solder balls of the necessary volume for the chip being repaired. The tip 13 of the tool is placed over a solder ball of a specific volume to match balls on the chip to be repaired. The controller 15 energizes the ultrasonic transducer 11, allowing the ultrasonic vibration to force solder into the cavity at the bottom of the tip.

In FIG. 6, the tool is shown adding a solder ball to a high density circuit chip 40. The tip containing the necessary volume of solder is placed over the base line metal at the space 41 where a solder was removed for repair. The controller 15 again energizes the ultrasonic transducer 11, releasing the solder and attaching it to the space 41 of the chip 40.

Figure 7:
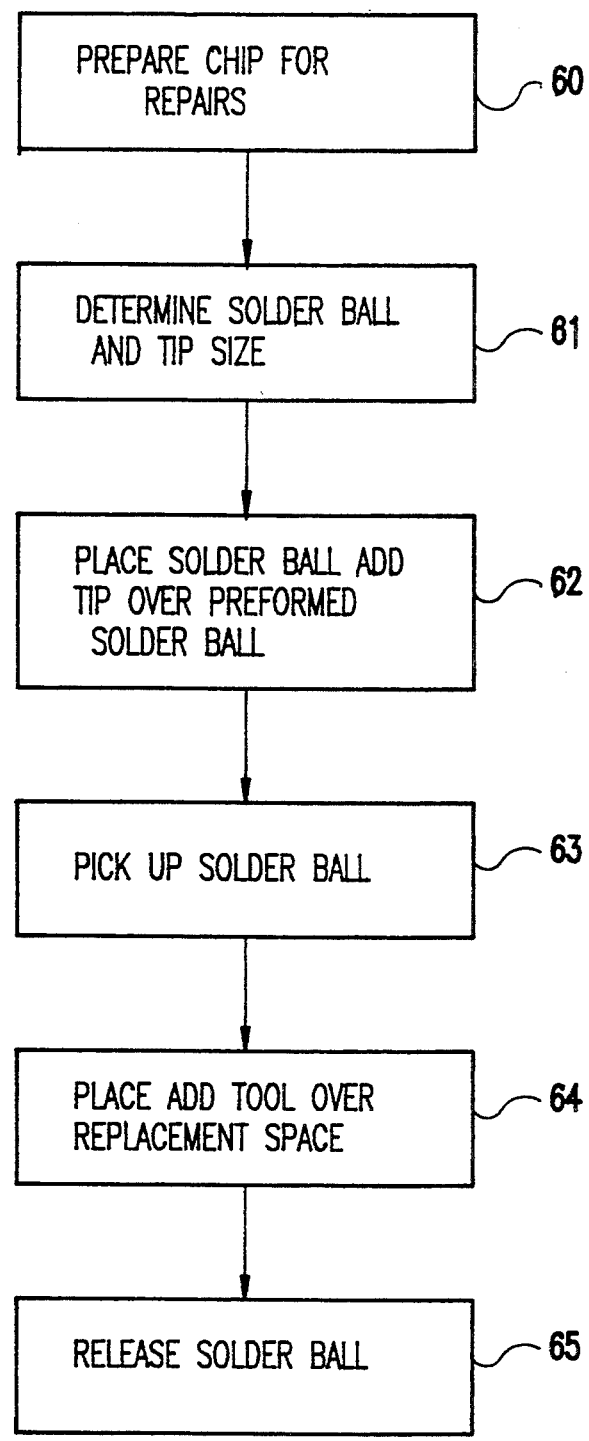
FIG. 7 is a flow chart of the steps of adding a solder ball using the solder ball add tool.

The flow diagram in FIG. 7 shows the steps employed in the use of this tool. First, a chip in need of repairs is prepared by removing unacceptable solder balls in step 60. The size of the solder balls to be replaced is determined, and a tip having appropriate volume is chosen in step 61. The solder ball add tip 13 is placed over a solder ball of desired volume and ultrasonic transducer 12 is energized in step 62. When the ultrasonic transducer is energized, the solder ball volume is picked up by the add tip 13 in step 63. The add tip 13 is placed over the chip 40 to be repaired in the position of the missing solder ball in step 64. The solder ball volume is released from the add tip 13 and attached to the chip BLM when the ultrasonic transducer is again energized in step 65.

Solder balls do not have to be preformed to a specific volume. The add tip 13 may pick up the desired volume of solder from larger solder balls since the volume picked up is limited by the volume of the cavity of the inverted cone in the tip. Likewise, the add tip 13 may pick up the desired volume of solder from a sheet of solder not formed in balls. These methods are not as efficient as preforming solder balls to a specific volume.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A tool for adding a solder ball of a specific volume to a prepared solder ball site in a solder ball array comprising:
   a cylindrical body having a conical tip at one end thereof, said conical tip having a cavity formed at its distal end, the cavity having a volume equal to said specific volume; and
   an ultrasonic transducer and horn attached to an end of said cylindrical body opposite said conical tip, said ultrasonic transducer being energized to produce vibrations which are propagated to said tip which, when said tip is placed over a source of solder, causes the solder to fill said cavity, and when placed over a desired position of the prepared solder ball site, causes the solder in the cavity to be released to adhere to said site.

2. A tool as recited in claim 1 wherein said tip is made from material selected from the group consisting of tungsten, titanium, tungsten carbide, titanium carbide, or alumina and the cavity has the shape of an inverted cone.

3. A tool as recited in claim 1 wherein said cylindrical body has a capillary extending the length of said cylindrical body and terminating at a base of said conical tip, said capillary receiving a source of energy for heating said tip to melt solder within the cavity of the tip, allowing solder released at said prepared solder ball site to reform as a solder ball without reflowing other solder balls in the array.

4. A method of replacing a single solder ball at a site in an array of solder balls comprising the steps of:
   positioning a cylindrical body having attached at one end a cone with a tip over a source of solder, said tip being formed with a small cavity having a volume equal to a desired volume the solder ball to be replaced;
   applying ultrasonic vibrations from a transducer to the cylindrical body, which vibrations are propagated to said tip causing solder from said source of solder to dislodge and fill said cavity with solder;
   positioning said tip over said site; and
   applying ultrasonic vibrations from the transducer to the cylindrical body to release the solder from the tip and attaching the solder to the site.

5. The method recited in claim 4 further comprising the step of heating the array of solder balls after attaching the solder to the site to reflow the solder balls.

6. The method recited in claim 4 wherein said cylindrical body has a capillary extending to said tip for conducting a energy to the tip and heating the tip, further comprising the step of heating the tip after attaching the solder to the site to reflow the solder and form a spherical solder ball without reflowing other solder balls in the array.

7. A method of adding a fine feature to a site on the surface of an article comprising the steps of:
   positioning a tool having a hollow conical tip over a source of material to be added to said surface, said tip being formed with a small cavity having a volume equal to a desired volume the material to be added;
   applying ultrasonic vibrations from a transducer to the tool, which vibrations cause material from said source to dislodge and fill said cavity;
   positioning said tip over said site; and
   applying ultrasonic vibrations from the transducer to the tool to release the material from the tip and attaching the material to the site.

8. The method recited in claim 7 wherein said material is heat flowable material, further comprising the step of heating said material after it is attached to the site to flow the material into a desired shape.

* * * * *